United States Patent [19]
Johnson

[11] Patent Number: 4,787,297
[45] Date of Patent: Nov. 29, 1988

[54] STACKED ROBOTIC WORK CELL PROCESS STATION

[75] Inventor: Jenny R. Johnson, Dallas, Tex.

[73] Assignee: Texas Instruments Incorporated, Dallas, Tex.

[21] Appl. No.: 89,896

[22] Filed: Aug. 27, 1987

[51] Int. Cl.$^4$ ............................................. B08B 15/02
[52] U.S. Cl. .................................... 98/115.3; 312/223; 312/290
[58] Field of Search .................. 98/1, 32, 33.1, 115.3, 98/36; 312/198, 209, 223, 237, 290; 901/50

[56] References Cited

U.S. PATENT DOCUMENTS

| | | | |
|---|---|---|---|
| 3,875,853 | 4/1975 | Pielkenroud | 98/115.3 X |
| 4,466,454 | 8/1984 | Layton | 98/115.3 X |
| 4,676,144 | 6/1987 | Smith | 98/115.3 X |
| 4,723,480 | 2/1988 | Yagi et al. | 98/115.3 |

FOREIGN PATENT DOCUMENTS

| | | | |
|---|---|---|---|
| 18134 | 5/1980 | Japan | 98/115.3 |
| 134238 | 10/1980 | Japan | 98/115.3 |

*Primary Examiner*—Harold Joyce
*Attorney, Agent, or Firm*—Frederick J. Telecky, Jr.; Thomas W. DeMond; Melvin Sharp

[57] ABSTRACT

A stacked robotic work cell process station is provided which includes first and second module chambers (14) and (26) which have associated therewith work surfaces (10) and (22). The first module chamber (14) is disposed above the work surface (22) in the second chamber (26) and staggered with respect thereto. A conduit (34) is provided for interfacing the upper surface of the chamber (26) with a point parallel to the upper surface of the first chamber (14) and adjacent thereto. A lower conduit (16) interfaces the lower portion of the first cell chamber with the lower portion of the second module chamber (26). A baffle (20) is provided for adjusting the air flow between the two chambers to provide isokinetic air flow at the upper surface of the stacked configuration.

12 Claims, 1 Drawing Sheet

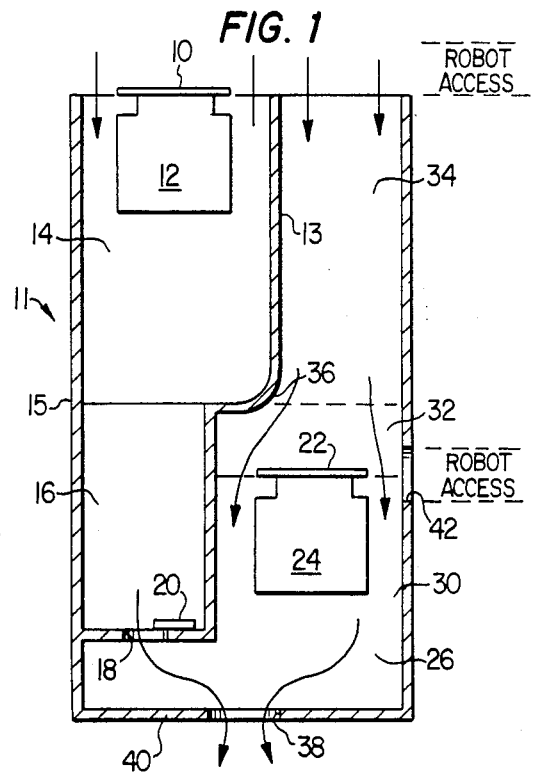
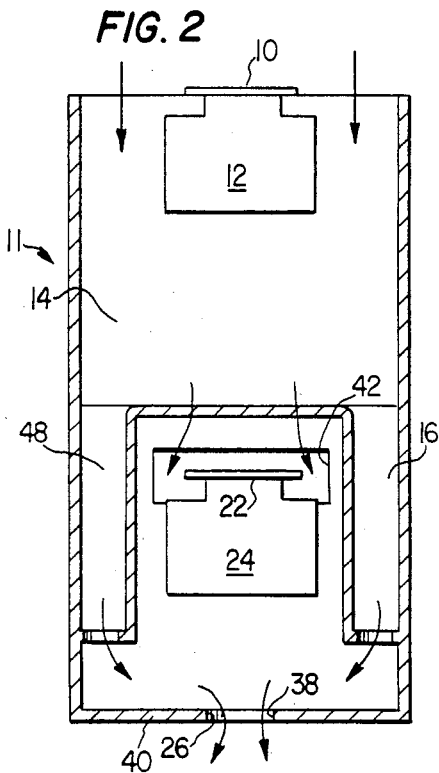
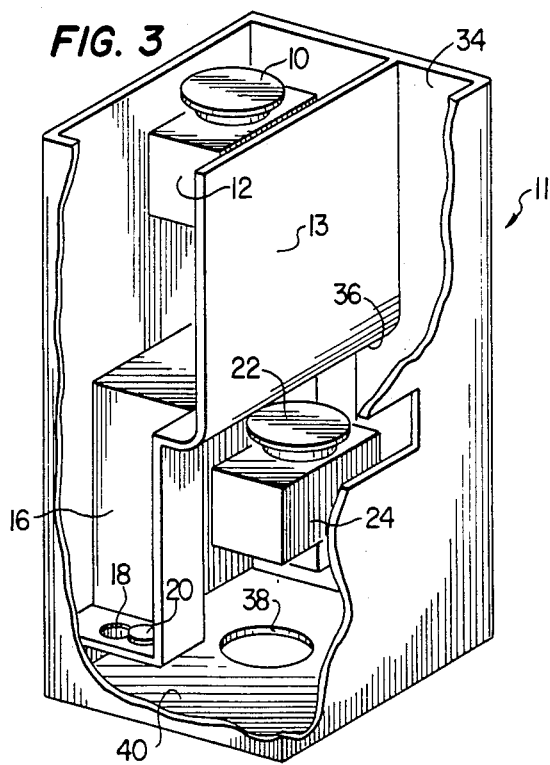
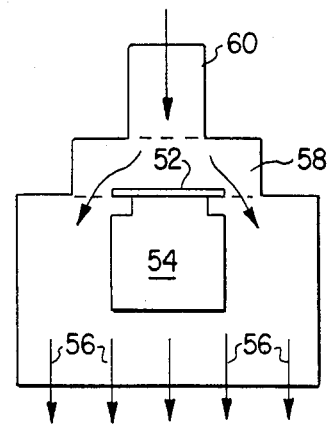

STACKED ROBOTIC WORK CELL PROCESS STATION

TECHNICAL FIELD OF THE INVENTION

The present invention pertains in general to robotic work cell process stations, and, more particularly, to a configuration of a modularized station that increases robotic efficiency and use of available space.

BACKGROUND OF THE INVENTION

As semiconductor processing and, in particular, wafer processing has become automated, the work cell process station has evolved utilizing various process stations in conjunction with a robotic system. This allows various steps in the process to be performed in discrete steps. Generally, these process stations are aligned side by side and a wafer or similar workpiece is transferred from one process station to another by a robotic arm. The entire operation is carried out in a ventilated clean room environment.

One limitation that has been recognized with respect to the process stations, is that they have a predefined "foot print." Generally, there is a work surface which has a predefined area with a requirement for some type of functional equipment and support structure therebelow. The work surface receives a workpiece and is positioned to allow air to flow thereover. There is a working area above the work surface to allow the robotic arm to manipulate the workpiece. It is imperative that two closely spaced process stations not contaminate one another and, thus, there is a requirement that air passing over one work surface be directed down the side of the work surface and away from any adjacent work surfaces. Therefore, there is a region provided about the periphery of the work surface for allowing air flow therethrough.

In a ventilated clean room, a predefined air flow passes from above the work surface to the floor on which the process station is disposed. This air flow is normally filtered prior to passing over the work surface and then passing through an orifice of some sort in the floor of the clean room. This air is continually circulated and filtered It is important not to have any contaminants enter the air stream prior to the air contacting the work surface. This is to ensure that no particulate matter enters the air stream that could potentially contaminate the workpiece that is disposed on the work surface.

One disadvantage of present process stations is that they must be disposed side by side. This arrangement does not provide for efficient use of space or efficient use of the robot's range of motion. If the process stations are spaced at too great a distance, an additional robot may be necessary, which could result in inefficient use of the robot's time in that one robot may be idle for a given time during the processing of a given workpiece. In view of these disadvantages, it is desirable to provide a process station that more efficiently utilizes the process modules with respect to their ability to interface with the robot.

SUMMARY OF THE INVENTION

The present invention disclosed and claimed herein comprises a stacked robotic work cell process station. The process station includes upper and lower process modules. Each process module has a process chamber associated therewith that has an upper open surface, a lower surface and rear and front sides. Each chamber is operable to contain a planar work surface being parallel with the upper surface of the associated module chamber and a functional mechanism for providing both functional and structural support for the associated work surface. The upper and lower module chambers are arranged in a stacked configuration with the upper module chamber having the upper surface thereof disposed above the lower module chamber. Air flow is provided in a downward direction, with a communication conduit provided for receiving the air in a plane parallel and adjacent to the upper surface of the upper module chamber and directing it toward the upper surface of the lower module chamber. The lower portion of the upper module chamber is in communication with the lower portion of the lower module chamber with the air flow in the two chambers being controlled to be isokinetic. Access is provided through the front surface of the lower module chamber to allow a robotic system to access the associated work surface.

In another embodiment of the present invention, the lower module chamber has the upper surface thereof disposed below the lower surface of the upper module chamber with the module chamber partially overlying the lower module chamber and disposed a predetermined distance above the lower module chamber. Both the lower portion of the lower module chamber and the lower portion of the upper module chamber are connected to an external orifice that is in the downward directed air stream so to allow air to flow outward from the lower portions of the upper and lower chambers. An adjustable orifice is provided in the upper module chamber to adjust the air flow therefrom to provide isokinetic air flow.

A technical advantage is provided by the present invention by providing a stacked configuration for the process modules that allows access to more than one work surface for a given range of horizontal motion of a robotic system by more efficiently utilizing the vertical range of motion of the robotic system. A further technical advantage is provided by adjusting the air flow between the two process modules such that the air flow directed downward into the process modules is isokinetic to prevent contamination of one work surface by the other work surface.

DETAILED DESCRIPTION OF THE DRAWINGS

For a more complete understanding of the present invention and the advantages thereof, reference is now made to the following description taken in conjunction with the accompanying Drawings in which:

FIG. 1 illustrates a cut away side view of two robotic process modules configured in a staggered arrangement;

FIG. 2 illustrates a rear view of the staggered process modules of FIG. 1;

FIG. 3 illustrates a perspective view of the staggered process modules of FIGS. 1 and 2; and FIG. 4 illustrates a schematic diagram of an individual process module.

DETAILED DESCRIPTION OF THE INVENTION

Referring now to FIG. 1, there is illustrated a cut away side view of a stacked work cell process station 11 which includes two individual process modules which are configured in a staggered arrangement. In the preferred embodiment, the staggered process modules are utilized in conjunction with a robotic system in a ventilated clean room. However, it should be understood that the basic concepts of the present invention can be utilized with any type of system which requires an isokinetic flow over adjacent work surfaces.

In FIG. 1 there is illustrated two process modules with the first process module comprised of a work surface 10 with an associated functional mechanism 12. The functional mechanism 12 depends upon the type of application that the process module is being utilized for. For example, the work surface may be utilized for heating the surface wherein electronic circuitry is provided for generating the heat in addition to the structural support necessary to position the work surface 10. Alternately, the functional mechanism 12 may be utilized to spin the work surface for such operations as spinning on photoresist. The work surface 10 provides the surface upon which a workpiece such as a wafer can rest. This surface can be a vacuum chuck, a set of locator pins, etc. A work area is provided above the work surface 10 which is utilized to allow robot access to the work surface to either place a workpiece thereon or remove a workpiece therefrom.

The work surface 10 and associated functional mechanism 12 are disposed in a first process module chamber 14 which has the upper surface thereof parallel with the work surface 10. The chamber 14 allows air to pass around the periphery of the work surface 10 and the functional mechanism 12. As will be described hereinbelow, isokinetic air flow is provided on the upper surface of the workpiece 10 which flows therearound and into the chamber 14. Any particulate matter that is present in the air stream is captured and carried into the chamber 14. The chamber 14 has an interior vertical wall 13 and an exterior boundary wall 15.

The chamber 14 at the lower end thereof has a conduit 16 interfaced therewith. The air stream flowing into the chamber 14 flows therefrom to the conduit 16 to an orifice 18 in the bottom of the conduit 16 which orifice is adjustable. In the preferred embodiment, one method of adjustment is to provide a sliding plate 20 which adjusts the size of the orifice. As will be described hereinbelow, this allows for balancing of the air flow.

A second process module is provided having a work surface 22 and an underlying functional mechanism 24. The work surface 22 and functional mechanism 24 are disposed in a second process module chamber 26 with the upper surface of the process module chamber being parallel with the work surface 22. The work surface 22 is staggered vertically with respect to the work surface 10 of the first process module to more efficiently utilize the vertical motion of the robotic system Within the same horizontal constraints. The chamber 26 has an interior wall 28, which coincides with one portion of the interior wall of the conduit 16, and an exterior wall 30. The interior wall 28 is directly underneath the chamber 14, such that the chamber 26 is staggered with respect to the chamber 14 both vertically and horizontally such that chamber 14 overlaps chamber 26. However, it should be understood that it is only necessary that the chamber 26 is below the work surface 10 and not that the chamber 14 overlaps chamber 26.

The work surface 22 has a work area chamber 32 disposed thereabove and extending to a predetermined height such that the lower surface of chamber 14 does not impede placement of a workpiece on the work surface 22. An upper conduit 34 allows air communication between the upper surface of the stacked process station 11, which is parallel to the work surface 10 of the first work cell process station, and the work area chamber 32. Air flow travels from the upper end of the conduit 34 into the work area chamber 32 and then around both the work surface 22 and the functional mechanism 22 and then into the chamber 26. For illustrative purposes, a dotted line has been provided between the conduit 34 and the work area chamber 32, and also between the work area chamber 32 and the second chamber 26.

To facilitate air flow around the junction of the interior wall of the chamber 34 and the upper boundary of the Work area chamber 32, a radius 36 about that edge is provided. This prevents the air from having to traverse a sharp corner. Air flow from the chamber 26 is routed to an orifice 28 in a bottom surface 40 of the work cell process station 11. Additionally, the orifice 18 in the conduit 16 is also in communication with the orifice 38 such that a negative pressure on the lower side of the orifice 38 results in air being pulled both from chamber 26 and also from conduit 16.

The work surface 22 is accessible through a slot 42 in the exterior wall of the work area chamber 32. This allows the arm of the robot (not shown) to place a workpiece on the work surface 22 or remove a workpiece therefrom. As described above, the vertical distance between the work surface 10 and the work surface 22 depends upon the vertical range of motion of the robotic system. Air flow from the exterior of the stacked work cell process station 11 is drawn into the chamber 26 and around the functional mechanism 24.

In operation, a clean environment is maintained at both the top and bottom of the stacked work cell process station 11. Clean ventilation is provided by the concept of ioskinetic flow. The air typically flows in a vertical direction from a source such as a ventilated hood at a rate of approximately 100 fpm. With ioskinetic flow, the resistance to the flow in the path of the upper process module is roughly equal to the resistance of the flow in the path of the lower process module such that the velocity of the air entering both the upper and lower process modules will be roughly equal. Therefore, air directed toward the upper process module will not exhibit a tendency to spill into the ventilation of the lower process module, or vice versa. This is isokinetic flow.

It is important for clean ventilation that all particulate matter above the work surfaces 10 and 22 be swept away and down about the periphery thereof and then swept out into the floor area through the orifice 38. By providing a conduit from the bottom of the chamber 14 through to the bottom of the chamber 26, this is possible. Further, by providing an adjustment for the air flow from conduit 16 to chamber 26, the air flow can be adjusted such that it is isokinetic. Particulate matter from the bottom of the chambers therefore will not contaminate one another and will result in uniform particulate flow through the upper and lower process modules through the orifice 38. It is also desirable to have relatively vertical walls within the conduit 34 to present minimal horizontal surface area to the air flow. This will reduce the particulate matter picked up from the sidewalls of the conduit 34 that could possibly be transferred to the surface of a workpiece resting on work surface 22. The air flowing through conduit 34 to work area chamber 32 will be swept around work surface 22 with any particulate matter into chamber 26. Although not shown, a stainless steel grill or perforated surface can be disposed at the input to the conduit 34 and also about the periphery of work surface 10. This will provide a larger number of small orifices which, proximate to the orifices, will have an increased air flow velocity. This increased air flow velocity will enhance the ability to "capture" particulate matter proximate to the orifices.

Referring now to FIG. 2, there is illustrated a rear view of the work cell process station 11, wherein like numerals refer to like parts in the various figures. The work surfaces 10 and 22 are operable to be accessed by the robot (not shown) from the front thereof. However, it is necessary sometimes to have access to the functional mechanisms 12 and 24 in order to set the various parameters or to maintain the units. To this extent, access is provided from the rear of the work cell process station 11. To facilitate access to the functional system 24 and chamber 26, conduit 16 is configured such that it is much thinner than chamber 14 and disposed only on one side of the work cell process station 11. A second conduit 48 is routed on the opposite side having one end thereof in communication with chamber 14 and the other end thereof provided with an orifice 50 for communication with the bottom of chamber 26 for allowing air to flow from conduit. 48 to the bottom of chamber 26 and out through orifice 38. Conduit 48 is configured identical to conduit 16. For simplicity purposes, the rear surface 15 is removed. Normally, rear surface 15 has access panels that can be removed. However, these panels must be in place during processing of a wafer in order to ensure the integrity of the air flow.

Referring now to FIG. 3, there is illustrated a perspective view of the stacked robotic work cell process station 11 of the present invention, wherein like numerals refer to like parts in the various figures. FIG. 3 illustrates the access provided to the robot (not shown) from the front of the work cell process station 11. The robot arm for a given station 11 can access the lower process station through access opening 42 to manipulate a Workpiece on the work surface 22, or to access the upper module to manipulate a workpiece on the work surface 10. It can be seen that the robotic arm need only move in the vertical direction to access two work surfaces. In prior art devices, the robotic arm needed to move in a horizontal direction. However, most commercially available robotic systems have a far greater vertical range than is being utilized. With the configuration of the present invention, both the vertical and horizontal range of motion of the robotic system is being utilized, resulting in a more efficient use of both space and the robotic system. This is accomplished without sacrificing access to the modules or particulate matter removal.

Referring now to FIG. 4, there is illustrated a basic diagram illustrating the overall footprint of a process module. Generally, the constraints of the process module are defined by a generic work surface 52 and a functional system 54 which underlies the work surface 52. This will provide a maximum width over which air must flow in order to sufficiently remove particulate matter from the upper surface of the work surface 52. A lower chamber 56 is defined with the upper boundary thereof parallel to the work surface 52 and the side boundaries thereof defined by the maximum width of the functional system 54. The lower surface is designed as a matter of functional necessity. A Work area chamber 58 is provided above the work surface 52. Chamber 58 has side boundaries which are determined by the amount of peripheral area required about the periphery of the work surface 52 to allow sufficient air flow to "capture" particulate matter and sweep it away from the surface of any workpiece disposed on the work surface 52. An inlet chamber 60 is provided for allowing vertical flow of air to the work area chamber 58. Dimensions of this conduit depend upon such factors as air flow, height of the work area chamber 58 and size of the work surface 52. However, it is only necessary that the air flow meet with little negative resistance from the work surface 52 such that the air entering the conduit 60 is isokinetic with any other process modules in proximity thereto. This will allow a clean ventilated air to flow through conduit 60, over work surface 52 and through chamber 56 to the bottom thereof.

Adjacent process modules can be staggered in any configuration as long as the appropriate air flow is provided. Of course, it is necessary to have access from one side by the robotic arm and from the other side for purposes of maintenance and access to the functional system 54. Once this is accomplished, the process modules can then be stacked in any vertical configuration. In fact, it is not necessary that the conduit 60 be vertical. It can be routed from an angle around another process module provided the contamination due to particulate matter from air passing around corners can be tolerated. If necessary, a filter can be placed at the top of the work area chamber 58.

In summary, there has been provided a stacked work cell process station for use with a robotic arm utilizing upper and lower process modules. Each of the modules is comprised of a chamber for containing the work surface and the underlying functional system that is associated with the work surface. Modules are functional to be mounted one above the other with the chambers staggered. Air is routed to the top of the upper chamber and through a conduit to the lower chamber associated with the lower module. A conduit is provided from the upper process module to the bottom portion of the chamber of the lower process module and out through an orifice. The air flow is adjusted through both process modules such that the flow is isokinetic.

Although the present invention has been disclosed and claimed herein it should be understood that various changes, substitutions and alterations can be made therein without departing from the spirit and scope of the invention as defined by the appended claims.

What is claimed is:

1. A stacked robotic work cell process station for processing a workpiece and being disposed in a ventilated environment with a downward directed air stream, comprising:
   a first process module having a first planar work surface;
   a first module chamber for containing said first process module and having an upper and open surface, a lower surface, a rear side and a front side, said first module chamber for containing said first process module with said first planar work surface being parallel to the upper surface of said first module chamber and perpendicular to the air flow with said first planar work surface being accessible from the front;
   a second process module having a second planar work surface;

a second module chamber for containing said second process module and having an upper and open surface, a lower surface, a rear side and a front side, the upper surface of said second module chamber being parallel to said second work surface and disposed a predetermined distance below the upper surface of said first module chamber, the front side of said second module chamber being parallel to the front side of said first module chamber with said second planar work surface being accessible from the front;

communication means for communicating between the lower portions of said first and second module chambers and the air stream to provide an even flow through said first and second module chambers from the upper open surfaces thereof through to the lower surfaces thereof; and the planar work surfaces of said first and second process modules accessible from the front side of said first and second module chambers, respectively, by an external robotic system.

2. The stacked robotic work cell process station of claim 1 and further comprising:

a work chamber disposed on the upper surface of said second module chamber and said second work surface;

a conduit in communication with said work chamber and a point proximate the plane of the upper surface of said first module chamber and adjacent to said first module chamber to allow communication of the air stream down through said conduit to said work chamber from the point proximate to the plane of the upper surface of said first module chamber; and an access opening in said work chamber parallel to the front side of said second module chamber to provide access to said second work surface.

3. The stacked robotic work cell process station of claim 2 wherein the cross sectional area of said conduit is less than the cross sectional area of said work chamber, the interface between said conduit and said work chamber having a radial contour such that air flow is enhanced therearound.

4. The stacked robotic work cell process station of claim 1 wherein said second module chamber is disposed in front of said first module chamber.

5. The stacked robotic work cell process station cf claim 1 wherein said first module chamber partially overlies the upper surface of said second module chamber with the lower surface of said first module chamber disposed a predetermined distance above the lower surface of said second module chamber.

6. The stacked robotic work cell process station of claim 1 wherein said communication means comprises:

a conduit having first and second ends, the first end thereof being in communication with the lower surface of said first module chamber and the other end thereof being in communication with a point proximate the lower surface of said second module chamber such that the air from the lower portion of said second module chamber and the air from the second end of said conduit are directed downward into the air stream; and adjusting means for adjusting the rate of flow through said conduit such that the flow through said first and second module chambers is isokinetic.

7. The stacked robotic work cell process station of claim 1 wherein said first and second process modules each have a functional mechanism associated with the associated ones of said first and second planar work surfaces, said functional mechanisms operable to provide both structural and functional support for a given process associated with said first and second process modules, respectively.

8. A stacked robotic work cell process station for processing a workpiece and being disposed in a ventilated environment with a downward directed air stream, comprising:

a first process module having:
a first module chamber with a lower surface, and an open upper surface, a front surface and a rear surface,
a planar work surface for receiving a workpiece, said planar work surface proximate to and parallel with the upper surface of said first module chamber, and
a functional mechanism disposed below said first work surface to provide both functional and structural support therefor; a second process module having:
a second module chamber with a lower surface, an open upper surface, a front surface and a rear surface,
a second planar work surface for receiving a workpiece, said second planar work surface disposed proximate and parallel With the upper surface of said second module chamber, and
a second functional mechanism disposed below said second work surface to provide both functional and structural support therefor;

said second process module disposed proximate to said first process module such that the upper surface thereof is below the upper surface of said first process module;

first conduit means for interfacing the upper open surface of said second process module with the downward directed air stream at a point proximate the upper surface of said first module chamber and adjacent thereto;

second conduit means connected between the lower portion of said first module chamber in said first work cell process module and the lower portion of said second module chamber in said second process module;

means for communicating with said downward directed air stream such that air is pulled in the open upper surfaces of said first and second module chambers and exiting from the lower portions thereof;

means for adjusting the air flow through said first and second module chambers to provide isokinetic flow; and an access opening for providing access from the front surface of said second module chamber to allow external access to said second work surface.

9. The stacked robotic work cell process station of claim B wherein said first conduit means comprises:

a conduit having a first open end and a second open end, the first open end disposed in a plane parallel with the upper surface of said first module chamber and adjacent thereto;

a work chamber disposed adjacent the upper surface of said second module chamber and defining a predetermined height above the upper surface of said second module chamber; and said work chamber interfaced with the second end of said conduit and the open upper surface of said second module chamber to allow air flow-therebetween.

10. The stacked robotic work cell process station of claim 9 wherein the surface area of the second open end of said conduit is smaller than the surface area of the upper surface of said work chamber wherein the junction between the upper surface of said work chamber and the second end of said conduit has a radial contour.

11. The stacked robotic work cell process station of claim 8 and further comprising access means for allowing access to said first and second process module chambers to provide access to said first and second functional mechanisms, respectively.

12. The stacked robotic work cell process station of claim 8 wherein said second work surface is disposed below the lower surface of said first module chamber with said first module chamber partially overlying said second module chamber and at a predetermined height above the upper surface of said second module chamber.

* * * * *